United States Patent
Naito

(10) Patent No.: US 8,907,352 B2
(45) Date of Patent: Dec. 9, 2014

(54) PHOTOELECTRIC CONVERSION ELEMENT AND MANUFACTURING METHOD THEREOF

(75) Inventor: Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,400

(22) Filed: Sep. 18, 2011

(65) Prior Publication Data

US 2012/0098028 A1    Apr. 26, 2012

(30) Foreign Application Priority Data

Oct. 22, 2010    (JP) ................. P2010-237405

(51) Int. Cl.
| | | |
|---|---|---|
| H01L 27/15 | (2006.01) | |
| H01L 51/42 | (2006.01) | |
| H01L 51/44 | (2006.01) | |
| H01L 51/00 | (2006.01) | |
| H01L 51/52 | (2006.01) | |
| C23C 16/26 | (2006.01) | |

(52) U.S. Cl.
CPC ............ *H01L 51/441* (2013.01); *Y02E 10/549* (2013.01); *H01L 51/4226* (2013.01); *H01L 51/0036* (2013.01); *H01L 51/5221* (2013.01); *H01L 51/426* (2013.01); *C23C 16/26* (2013.01); *H01L 51/0037* (2013.01)
USPC 257/79; 257/448; 257/E31.126; 257/E33.064

(58) Field of Classification Search
USPC ............. 257/79, 448, 461, E31.126, E33.064
See application file for complete search history.

(56) References Cited

U.S. PATENT DOCUMENTS

| | | | | |
|---|---|---|---|---|
| 5,783,292 | A | * | 7/1998 | Tokito et al. .................. 428/212 |
| 6,060,729 | A | * | 5/2000 | Suzuki et al. .................... 257/99 |
| 6,117,529 | A | * | 9/2000 | Leising et al. ................ 428/209 |
| 7,071,258 | B1 | | 7/2006 | Jang et al. |
| 2005/0045874 | A1 | * | 3/2005 | Xiao et al. ...................... 257/40 |
| 2009/0071533 | A1 | | 3/2009 | Choi et al. |
| 2009/0146111 | A1 | * | 6/2009 | Shin et al. ..................... 252/510 |
| 2010/0102292 | A1 | * | 4/2010 | Hiura et al. ....................... 257/9 |
| 2011/0127471 | A1 | * | 6/2011 | Shin et al. ..................... 252/506 |

FOREIGN PATENT DOCUMENTS

| | | |
|---|---|---|
| JP | 6-93258 | 4/1994 |
| JP | 2005-340496 | 12/2005 |
| JP | 2008-103329 | 5/2008 |
| JP | 2008-239468 | 10/2008 |
| JP | 2010-219212 | 9/2010 |
| WO | WO 2008/108383 A1 | 9/2008 |

OTHER PUBLICATIONS

U.S. Appl. No. 13/622,021, filed Sep. 18, 2012, Naito, et al.
U.S. Appl. No. 13/621,997, filed Sep. 18, 2012, Naito, et al.

(Continued)

*Primary Examiner* — Tucker Wright
(74) *Attorney, Agent, or Firm* — Oblon, Spivak, McClelland, Maier & Neustadt, L.L.P.

(57) ABSTRACT

A photoelectric conversion element in accordance with an embodiment includes a photoelectric conversion layer, a cathode electrode, and an anode electrode. The cathode electrode is arranged on one surface of the photoelectric conversion layer and includes monolayer graphene and/or multilayer graphene in which a portion of carbon atoms is substituted with at least nitrogen atoms. The anode electrode is arranged on the other surface of the photoelectric conversion layer.

11 Claims, 1 Drawing Sheet

(56) References Cited

OTHER PUBLICATIONS

Notice of Preliminary Rejection issued Jan. 25, 2013 in Korean Patent Application No. 10-2011-0107925 (with English translation).
Liangti Qu et al., "Nitrogen-Doped Graphene as Efficient Metal-Free Electrocatalyst for Oxygen Reduction in Fuel Cells", ACS NANO vol. 4, No. 3, 2010, pp. 1321-1326.
Zongyou Yin et al., "Electrochemical Deposition of ZnO Nanorods on Transparent Reduced Graphene Oxide Electrodes for Hybrid Solar Cells", Small, vol. 6, No. 2, 2010, pp. 307-312.
Office Action and Search Report issued on Dec. 19, 2013 in the corresponding Chinese Patent Application No. 201110329938.4 (only English Translation).
Japanese Office Action issued Apr. 11, 2014, in Japan Patent Application No. 2010-237405 (with English translation).
Japanese Office Action issued Jun. 27, 2014, in Japan patent Application No. 2010-237405 (with English translation).
Chinese Office Action issued Jul. 28, 2014 in Patent Application No. 201110329938.4 with English Translation.

* cited by examiner

PHOTOELECTRIC CONVERSION ELEMENT AND MANUFACTURING METHOD THEREOF

CROSS REFERENCE TO RELATED APPLICATION

This application is based upon and claims the benefit of priority from the prior Japanese Patent Application No. 2010-237405, filed on Oct. 22, 2010, the entire contents of which are incorporated herein by reference.

FIELD

Embodiments relate basically to a photoelectric conversion element and a manufacturing method thereof.

BACKGROUND

A photoelectric conversion element such as a photovoltaic cell, an organic EL (electroluminescence) element, or an optical sensor has been conventionally developed.

The photoelectric conversion element has a photoelectric conversion layer, a cathode electrode arranged on one surface of the photoelectric conversion layer, and an anode electrode arranged on the other surface of the photoelectric conversion layer. As this anode electrode, an indium-tin oxide (ITO) film is generally used. As the cathode electrode, aluminum (Al), which has a small work function, or a magnesium alloy (Mg), which has a smaller work function than Al, is used.

A photoelectric conversion element is disclosed, which uses the ITO film as a cathode electrode and a metal having a large work function as an anode electrode As an inexpensive, stable, and flexible transparent electrode, a carbon nanotube is disclosed. Such an electrode does not use indium (In), which is a rare metal to be used in the aforementioned ITO film. Carbon nanotube films which have an unsubstituted graphene structure or planar graphene thin films are used as transparent electrodes.

BRIEF DESCRIPTION OF DRAWINGS

Aspects of this disclosure will become apparent upon reading the following detailed description and upon reference to accompanying drawings.

DESCRIPTION

Figure 1:
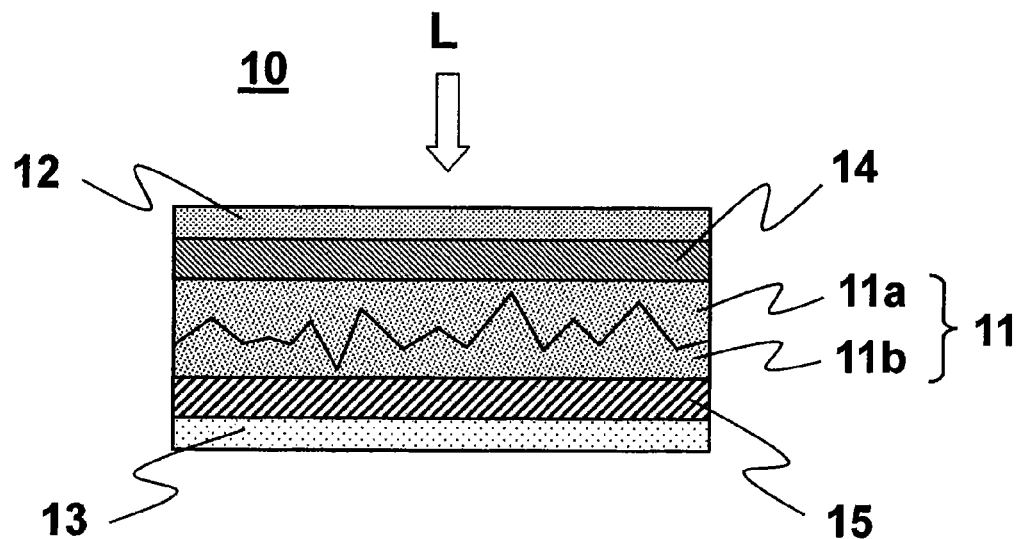
FIG. 1 is a sectional view schematically showing a photovoltaic cell of a second embodiment.

Embodiments will be described below with reference to drawings. Wherever possible, the same reference numerals or marks will be used to denote the same or like portions throughout figures. The drawings are conceptual. Therefore, a relationship between a thickness and a width of each portion and a proportionality factor among the respective portions are not necessarily the same as an actual thing.

As will be described below, a photoelectric conversion element in accordance with an embodiment includes a photoelectric conversion layer, a cathode electrode, and an anode electrode. The cathode electrode is arranged on one surface of the photoelectric conversion layer and includes monolayer graphene and/or multilayer graphene in which a portion of carbon atoms is substituted with at least nitrogen atoms. The anode electrode is arranged on the other surface of the photoelectric conversion layer.

A manufacturing method of a photoelectric conversion element in accordance with another embodiment includes forming a cathode electrode on a substrate, forming a photoelectric conversion layer on the cathode electrode, and forming an anode electrode on the photoelectric conversion layer. The cathode electrode includes monolayer graphene and/or multilayer graphene in which a portion of carbon atoms is substituted with at least nitrogen atoms.

Embodiments will be described below with reference to drawings.

Conventionally, an ITO film is generally used as an anode electrode of a photoelectric conversion element. Al or a Mg alloy is used as a cathode electrode. An ITO film, Al, and a Mg alloy tend to be oxidized by moisture or oxygen. A metallic interface particularly tends to be oxidized. While, the oxidized metallic interface significantly inhibits the injection performance of charges therethrough, although the bulk conductivity is maintained.

For this reason, the oxidation is prevented by tight sealing or sealing by mixing a moisture-removal agent, an oxygen-removal agent, and the like. However, it is difficult to remove moisture completely from a photoelectric conversion layer to be formed by application or the like. This causes a short duration and a complicated element structure for removing moisture and oxygen, thereby leading to a cost increase and a problem in making flexible.

A photoelectric conversion element includes an ITO film as a cathode electrode and a metal having a large work function as an anode electrode. Such a photoelectric conversion element is provided with an n-type transparent semiconductor layer such as zinc oxide (ZnO) between the ITO film and a photoelectric conversion layer. The transparent semiconductor layer allows charges to be easily injected from the cathode electrode to the photoelectric conversion layer. However, the transparent semiconductor layer causes problems such as an increase in resistance, a decrease in efficiency, instability of the ZnO layer, and the like. In addition, the ITO film has a limit regarding chemical stability. The ITO film also has disadvantages of embrittlement and less flexibility in a filmy state.

When using a carbon nanotube or a planar graphene thin film as a stable and flexible transparent anode electrode instead of the ITO film, tight sealing is required to use a metal having a small work function. Such a carbon nanotube has an unsubstituted graphene structure. The tight sealing prevents the graphene thin film from exploiting the characteristics thereof, i.e., a low price and flexibility.

To solve the conventional problems, the present disclosure provides a stable, highly efficient photoelectric conversion element and a manufacturing method thereof.

First Embodiment

A photoelectric conversion element in accordance with a first embodiment includes a photoelectric conversion layer, a cathode electrode, and an anode electrode. The cathode electrode includes a monolayer graphene and/or multilayer graphene in which a portion of carbon atoms is substituted with at least nitrogen atoms. The anode electrode is arranged on the other surface of the photoelectric conversion layer.

In the present embodiment, the monolayer graphene and/or multilayer graphene are/is used as the cathode electrode of the photoelectric conversion element. The portion of carbon atoms is substituted with at least nitrogen atoms (N) in the graphene. Such a structural body having the monolayer graphene and/or multilayer graphene substituted with nitrogen atoms is an n-type semiconductor. The structural body has a smaller work function than the unsubstituted graphene which is not substituted with atoms such as nitrogen atoms other than carbon atoms. This is due to the fact that tetravalent carbon atoms are substituted with pentavalent nitrogen atoms to make the nitrogen atoms positive, and electrons are emitted from the nitrogen atoms to a skeleton of the graphene. Accordingly, when the structural body is used as the cathode electrode, an energetic barrier with an n-type semiconductor layer of the photoelectric conversion layer is reduced, thereby enabling an efficient exchange of electrons.

In the present embodiment, the monolayer graphene and/or multilayer graphene are/is preferably planar. The planer graphene can balance both transparency and electric conductivity more easily than a curved one such as a carbon nanotube. Alternatively, a mixture or a laminated body of planar graphene and curved graphene may be used.

The cathode electrode of the present example is preferably transparent. This is due to the fact that opaque and stable materials, such as metals or semiconductors having a large work function, can be used as the anode electrode.

The graphene may include monolayer and/or multilayer. The larger the number of graphene layers is, the higher the conductivity becomes, but the lower the light transmission becomes. Thus, the number of graphene layers is preferably 10 or less, and more preferably 1 to 5.

A high-resolution transmission electron microscope (TEM) observation can reveal the number of graphene layers in the carbon nanotube. A cross-sectional TEM observation can reveal the number of graphene layers in the planar graphene.

In the present embodiment, a work function of the cathode electrode is preferably equivalent to or smaller than that of Al. Such a smaller work function provides a smoother exchange of electrons between the photoelectric conversion layer and the cathode electrode.

The work function is smaller when the number of substituted nitrogen atoms is larger in the monolayer graphene and/or multilayer graphene. However, when carbon atoms are substituted with nitrogen atoms excessively, electron scattering occurs so frequently that the structure of the graphene is unsteady. This lowers electric conductivity and transparency. Accordingly, the substitution amount of the nitrogen atoms is preferably 0.1 to 30 atom %, and more preferably 1 to 10 atom %.

The substitution amount of the nitrogen atoms can be measured by X-ray photoelectron spectroscopy (XPS). A C/N ratio can be calculated from an intensity ratio of a signal from the carbon atom C1s around 290 eV to a signal from the nitrogen atom N1s around 400 eV. A substance having a clear composition such as carbon nitride having a stoichiometric composition of $C_3N_4$ can be used as a standard substance. The surface of the electrode of a product is exposed to be measured with XPS. The graphene is stable to various solvents (e.g., methanol), thereby allowing it to conduct XPS measurement after removing impurities adsorbed on the surface of the graphene by cleansing the surface with a solvent.

In the present embodiment, a portion of carbon atoms is preferably further substituted with at least one kind of atoms selected from the group consisting of oxygen atoms (O), boron atoms (B), phosphorus atoms (P), and arsenic atoms (As). In addition to the substitution with nitrogen atoms, the substitution with these kinds of atoms also allows it to finely control the work function, band gap, hydrophilicity, hydrophobicity, and the like, thereby leading to fine controls of the performance and manufacturing process of the photoelectric conversion element.

Substitution of atoms other than nitrogen atoms is conducted by high-temperature processing, ion implantation, plasma processing, or the like. The substitution amount can be determined by XPS measurement as well as the substitution by nitrogen atoms.

The present embodiment is provided with metal wiring for power collection which is preferably formed on the cathode electrode, thereby decreasing electric resistance. Materials of the metal wiring include gold (Au), copper (Cu), silver (Ag), titanium (Ti), tungsten (W), aluminum (Al), or the alloys of these. The materials make ohmic contacts with the cathode electrode. More preferably, an Ag paste to be applied or foils of various metals is used to be attached or pressure-bonded.

In the present embodiment, an electron injection layer is preferably arranged between the cathode electrode and the photoelectric conversion layer. The electron injection layer serves to reduce a barrier against an electron injection from the cathode electrode to the photoelectric conversion layer (organic EL element or the like) or an electron injection from the photoelectric conversion layer to the transparent cathode electrode (photovoltaic cell or the like). The electron injection layer can also prevent a hole flow to enable it to enhance the energy conversion efficiency. For the electron injection layer can be used an alkali metal or alkaline earth metal salt such as LiF, NaF, CsF, $MgF_2$, $CaF_2$, $CaCO_3$, $Cs_2Co_3$, ZnO, or $TiO_2$, an n-type oxide semiconductor, or an oligomer or a polymer having a π-electron system substituted with two or more electron-withdrawing groups such as fluorine and cyano groups.

It is possible to use a known material such as an ITO film for the anode electrode of the present embodiment. The anode electrode is arranged on one surface of the photoelectric conversion layer. The cathode electrode is arranged on the other surface thereof facing the surface on which the cathode electrode is arranged.

For this anode electrode is preferably used a metal, alloy, or semiconductor which has a comparatively large work function and is comparatively stable to moisture, oxygen, and the like. Such a material enables it to dispense with improvement in the duration and tight sealing, thereby enabling cost reduction and flexibility. For the anode electrode is more preferably used a material having a larger work function than Al. Such a material is more stable to moisture and oxygen.

Examples of the material having a larger work function than Al include Cu, Ag, stainless steel (SUS304, SUS310S, high-nitrogen stainless steel, stainless steel covered with a conductive highly corrosion-resistant film, or the like), zinc (Zn), titanium (Ti), tungsten (W), molybdenum (Mo), chromium (Cr), nickel (Ni), alloys of these, an ITO, unsubstituted planar graphene, planar graphene partially substituted with boron atoms, an unsubstituted carbon nanotube, and a carbon nanotube partially substituted with boron atoms. Particularly, the anode electrode preferably includes unsubstituted monolayer graphene or multilayer graphene, or monolayer graphene, or multilayer graphene partially substituted with boron atoms. The unsubstituted graphene has a work function approximately equal to that of graphite. The graphene substituted with boron atoms has a larger work function and is more preferable for the anode electrode. Also, both the electrodes preferably include graphene to enable flexibility of the photoelectric conversion element.

A value of the work function depends significantly on a surface structure or adsorption of other atoms. The work function can be measured by a Kelvin method (vibration capacity method), thermionic electron emission, or a photoelectric emission experiment.

In the present embodiment, a hole injection layer is preferably provided between the anode electrode and the photoelectric conversion layer. This hole injection layer serves to reduce a barrier against a hole injection from the anode electrode to the photoelectric conversion layer (organic EL elements or the like) or a hole injection from the photoelectric conversion layer to the anode electrode (photovoltaic cells or the like). The hole injection layer has a blocking characteristic to prevent flow of electrons, thereby enabling it to enhance the energy conversion efficiency. For the hole injection layer can be used a p-type semiconductor such as a complex of poly(3,4-ethylenedioxythiophene) and poly (styrenesulfonic acid) (PEDOT/PSS), vanadium oxide ($V_2O_5$), or molybdenum oxide ($MoO_3$).

In the present embodiment, graphene of the cathode electrode is preferably doped with electron donating molecules or atoms. Or, electron accepting molecules or atoms are preferably doped into graphene of the anode electrode. The doping improves conductivity of graphene and facilitates electron injection and hole injection to each electrode made of graphene. The electron donating molecules include phthalocyanines, ferrocenes, porphyrins, TTFs, phenylenediamines, tertiary amines. The electron donating substances include alkali metals, alkaline earth metals, aluminum, zinc, iron. Regarding the metals, ions or nanoparticles can be used. The electron accepting substances include TCNQs, quinones, halogen molecules, quinodiimines, a nitric acid, a hydrochloric acid, a sulfuric acid, a perchloric acid. The halogen molecules are introduced into an atomic (ionic) state such as chlorine ions. Particularly, accepting molecules are preferably eccentrically located on the side of the cathode electrode. This enables efficient charge separation and charge injection.

In the present embodiment, the anode electrode is preferably transparent. The transparency enables both the cathode electrode and the anode electrode to be transparent. For example, electricity can be generated using light through both the electrodes in a photovoltaic cell, while light can be emitted to both the electrodes due to the transparency in an organic EL element or the like. The photoelectric conversion element of the present embodiment is effectively used particularly for a window or the like. When the photoelectric conversion element is effectively used for an optical sensor, elements measuring different wavelengths can be laminated.

The photoelectric conversion layer of the present embodiment can include conventionally known materials and preferably includes at least an n-type material and a p-type material. In addition, the n-type and p-type materials serve as stacked layers, or the respective n-type and p-type materials are preferably phase-separated substantially in a single layer. Examples of the photoelectric conversion layer enabling efficient charge separation and charge injection include a bulk heterojunction organic thin-film layer, a silicon semiconductor, inorganic compound semiconductors such as InGaAs, GaAs, a chalcopyrite type, a CdTe type, an InP type, and an SiGe type, a quantum-dot containing type, and a dye sensitized type. All the examples have a high efficiency of energy conversion and retain the outputs thereof for a comparatively long term with easy sealing and even without a moisture-removing agent or an oxygen removing agent. In an organic EL element as one of the examples can use a low-molecular thin film formed by vacuum deposition, a polymer thin film formed by application, and an inorganic compound semiconductor. In all the examples, the efficiency is high, and the output deterioration can be reduced by easier sealing even without moisture-removing agents or oxygen removing agents.

In the present embodiment, the photoelectric conversion layer preferably includes an organic thin film. Graphene used for the cathode electrode and the anode electrode has a structure of condensed benzene rings and readily interacts with the organic thin film. The organic thin film has aromatic rings used for the photoelectric conversion layer. The graphene can form a clear interface.

The photoelectric conversion layer of the present embodiment preferably includes a component formed by application. Forming the photoelectric conversion layer by application enables a large area and a low cost. Nevertheless, although it is difficult to eliminate adverse effects of moisture and oxygen completely in the application process, the adverse effects can be reduced by the cathode electrode of the present embodiment to be stable to moisture and oxygen.

In the present embodiment, the cathode electrode, the photoelectric conversion layer, and the anode electrode are preferably sealed, and a moisture-removing agent or an oxygen removing agent is preferably not placed. This dispenses with a space for these agents and structural materials, thereby enabling a more flexible and inexpensive element.

The cathode electrode, the photoelectric conversion layer, and the anode electrode can be sealed by molding the entire photoelectric conversion element with an epoxy resin, a silicone resin, polyolefin, or the like all of which are cured.

A manufacturing method of a photoelectric conversion element in accordance with the present embodiment includes the following steps:

forming a cathode electrode on a substrate, such as a polyethylene terephthalate (PET) film, a polyethylene naphthalate (PEN) film, or a transparent polyimide (PI) film, the cathode electrode including monolayer graphene and/or multilayer graphene, the graphene having a portion of carbon atoms which is substituted with at least nitrogen atoms;

forming a photoelectric conversion layer on the cathode electrode; and forming an anode electrode on the photoelectric conversion layer.

This method does not damage the photoelectric conversion layer and can well make electrical contacts with the cathode electrode.

The monolayer graphene and/or multilayer graphene partially substituted with nitrogen atoms to be used for the cathode electrode can be produced in the following method, for example.

The monolayer graphene partially substituted with nitrogen atoms is first produced by a chemical vapor deposition (CVD) method using a Cu foil as a base catalyst layer and using a mixed reaction gas of ammonia, methane, hydrogen, and argon. After heated in a mixed gas of ammonia and argon, the monolayer graphene is cooled in an argon gas stream. The surface of the Cu foil is preferably annealed beforehand by laser irradiation heating to grow the crystal grains of the Cu foil. After a polyethylene terephthalate (PET) film and the monolayer graphene obtained are pressure-bonded, the pressure-bonded is immersed in an ammonia alkaline copper chloride etchant to dissolve Cu, thereby transferring the monolayer graphene to the PET film. The multilayer graphene can be obtained by lamination through repeating the same steps. In forming metal wiring for power collection on the graphene obtained, a conductive Ag paste is printed, or a conductive ribbon such as an Al foil is pressure-bonded.

Alternatively, the producing method of the graphene partially substituted with nitrogen atoms may use a low-molecular nitrogen compound as raw materials for CVD. Examples of the low-molecular nitrogen compound include pyridine, methylamine, ethylene diamine, and urea instead of an ammonia gas, or include ethylene, acetylene, methanol, and ethanol.

The graphene can also be produced as follows. A water dispersion solution of graphene oxide is made to be a filmy form on a metal (e.g., Cu) by spin coating. Subsequently, the filmy form is heated in a mixed gas of ammonia, hydrogen, and argon for nitrogen substitution of the graphene. The filmy form is transferred onto the PET film to obtain monolayer graphene as well, instead of in the aforementioned method using the CVD method. Alternatively, the graphene can be produced by processing an unsubstituted graphene thin film in nitrogen plasma. Alternatively, the graphene can be produced by supplying microwaves in a mixed atmosphere of ammonia, methane, hydrogen, and argon on a Cu foil, thereby generating plasma to produce a nitrogen-substituted graphene thin film to be transferred to the PET film as well.

Also, the unsubstituted monolayer graphene and/or multilayer graphene to be used for the anode electrode can be produced in the following method, for example.

The monolayer graphene is first produced by CVD using a Cu foil as a base catalyst layer and using a mixed reaction gas of methane, hydrogen, and argon. After the PET film and the monolayer graphene are pressure-bonded, Cu is dissolved to transfer the monolayer graphene onto the PET film. The multilayer graphene can be obtained by lamination through repeating the same steps. In order to form metal wiring for power collection on the graphene, a conductive paste such as Ag is printed, or a conductive ribbon such as an Al foil is pressure-bonded.

Meanwhile, the graphene partially substituted with boron atoms is produced in a mixed reaction gas of diborane, methane, hydrogen, and argon.

In order to form the electron injection layer between the cathode electrode and the photoelectric conversion layer, a method in accordance with the present embodiment is employed. The method includes forming the electron injection layer after forming the cathode electrode and before forming the photoelectric conversion layer on the cathode electrode.

In case that the hole injection layer is formed between the photoelectric conversion layer and the anode electrode, the method in accordance with the present embodiment includes forming the hole injection layer before forming the anode electrode on the photoelectric conversion layer.

After forming the respective layers, i.e., the electron injection layer and forming the hole injection layer, the respective layers are preferably heated simultaneously with pressure bonding or heated after pressure bonding to make good electric contacts of interfaces therebetween with each other. This enables it to make good electric contacts of the interfaces therebetween.

In the present embodiment, a second photoelectric conversion layer is preferably formed after forming the photoelectric conversion layer on the cathode electrode. Forming the second photoelectric conversion layer allows further improvement in efficiency and absorption/emission of light having different wavelengths. The two photoelectric conversion layers may be directly in contact with each other, or may be formed via a conductive layer, or may be provided with a buffer layer such as an ultra thin insulating layer. The two photoelectric conversion layers are preferably heated during the lamination of the two layers, or heated after the lamination thereof. This enables good electrical contacts of the interfaces therebetween with each other.

This second photoelectric conversion layer may include the same material and structure as those of the other photoelectric conversion layer or may include a different material and structure.

Alternatively, a carbon nanotube may be used instead of the monolayer graphene and/or multilayer graphene partially substituted with nitrogen atoms to be used for the cathode electrode. In this case, the carbon nanotubes are produced by CVD in a gas stream containing ammonia so that carbon nanotubes produced are uniformly-sized as much as possible. The uniformly-sized nanotubes are applied by spin coating or dipping coating to form a transparent electrode.

Hereinafter, two embodiments will be described for applying the photoelectric conversion element of the first embodiment to a photovoltaic cell and an organic EL element.

Second Embodiment

FIG. 1 is a sectional view showing a photovoltaic cell 10 to be a photoelectric conversion element in accordance with a second embodiment.

The photovoltaic cell 10 is an element serving as a photovoltaic cell to convert light energy into electricity. The light energy is energy of light L such as solar light incident on the cell.

The photovoltaic cell 10 includes a photoelectric conversion layer 11, a cathode electrode (front electrode) 12 provided on one surface of the photoelectric conversion layer 11, and a anode electrode (rear electrode) 13 provided on the opposite side of the cathode electrode 12 from the photoelectric conversion layer 11. The photoelectric conversion layer 11 is a semiconductor layer which converts a light energy of incident light L into electricity to generate an electric current. The photoelectric conversion layer 11 generally includes a p-type semiconductor layer 11a and an n-type semiconductor layer 11b. In general, the interface between the semiconductor layers 11a and 11b is rough as shown in FIG. 1 to enhance the light absorbing performance. An electron injection layer 14 is provided between the photoelectric conversion layer 11 and the cathode electrode 12. In addition, a hole injection layer 15 is provided between the photoelectric conversion layer 11 and the anode electrode 13.

It is to be noted that the photovoltaic cell of the present embodiment can be used as an optical sensor. The graphene thin film is transparent to visible light to infrared, thereby allowing it to use the photovoltaic cell as an infrared sensor when a photoelectric conversion layer to be used is sensitive to infrared.

Third Embodiment

Figure 2:
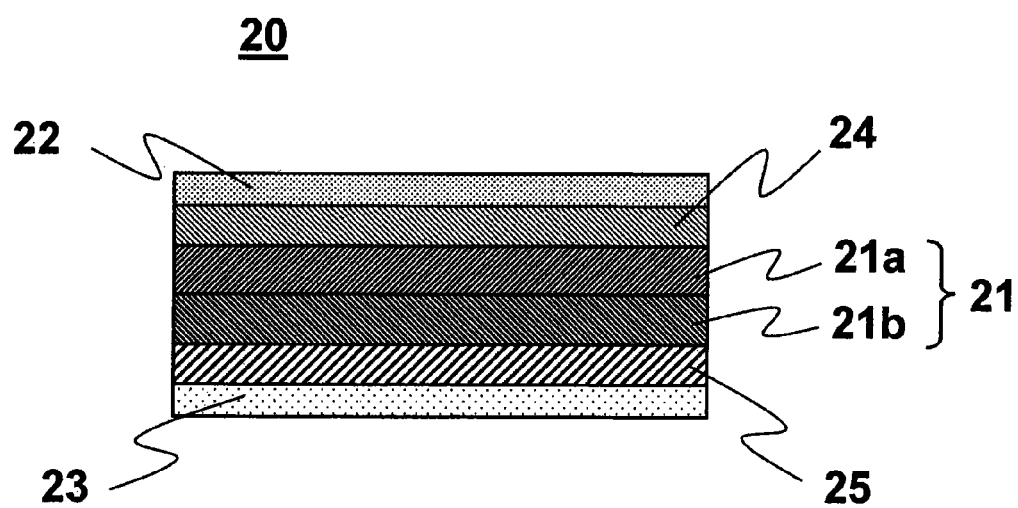
FIG. 2 is a sectional view schematically showing an organic EL element of a third embodiment.

FIG. 2 is a sectional view showing an organic EL element 20 to be a photoelectric conversion element in accordance with a third embodiment.

The organic EL element 20 is an element serving as a light-emitting element to convert electric energy inputted to the element into light.

The organic EL element 20 includes a photoelectric conversion layer 21, a cathode electrode (front electrode) 22 provided on one surface of the photoelectric conversion layer 21, and an anode electrode (rear electrode) 23 provided on the opposite side of the cathode electrode 22 from the photoelectric conversion layer 21. The photoelectric conversion layer 21 is an organic thin-film layer to recombine electrons injected from the front electrode and holes injected from the rear electrode, thereby converting electric energy into light. The photoelectric conversion layer 21 generally includes a p-type semiconductor layer 21a and an n-type semiconductor layer 21b. An electron injection layer 24 is provided between the photoelectric conversion layer 21 and the cathode electrode 22. In addition, a hole injection layer 25 is provided between the photoelectric conversion layer 21 and the anode electrode 23.

The embodiments will be described more specifically using examples and comparative examples.

Example 1

In the photovoltaic cell 10 shown in FIG. 1, the cathode electrode 12 is a sheet in which planar monolayer graphene partially substituted with nitrogen atoms is transferred to a PET film. The planar monolayer graphene substituted with nitrogen atoms is formed by CVD at 1000° C. for 5 minutes using a Cu foil as a base catalyst layer and in a mixed reaction gas stream of ammonia, methane, hydrogen, and argon (15:60:65:200 ccm). Subsequently, after the graphene is processed at 1000° C. for 5 minutes in a mixed gas stream of ammonia and argon, the graphene is cooled in an argon gas stream. The surface of the Cu foil is annealed beforehand by laser irradiation heating to grow the crystal grains of the Cu foil. After the PET film (150 μm thick) and the monolayer graphene are pressure-bonded, the pressure-bonded is immersed in an ammonia alkaline copper chloride etchant to dissolve Cu, thereby transferring the monolayer graphene to the PET film. 4 monolayers of the graphene are laminated on the PET film through repeating the same steps. The doping amount of nitrogen atoms (N/C atom ratio) is estimated by X-ray photoelectron spectroscopy (XPS) to be 1 to 4atom % under these forming conditions. The work function is measured in a vacuum by ultraviolet photoelectron spectroscopy (UPS) and is equivalent to or smaller than that of Al. Subsequently, metal wiring for power collection is formed by printing a Ag paste.

The anode electrode 13 is a sheet on which unsubstituted planar monolayer graphene is transferred to a PET film. The unsubstituted monolayer graphene is formed by CVD using a Cu foil as a base catalyst layer in a mixed reaction gas of methane, hydrogen, and argon. After the PET film and the monolayer graphene are pressure-bonded, Cu is dissolved to transfer the monolayer graphene to the PET film. 4 monolayers of the graphene are laminated on the PET film through repeating the same steps. Subsequently, metal wiring for power collection is formed by printing a Ag paste.

The photoelectric conversion layer 11 (120 nm thick) is formed by applying a $TiO_2$ thin film (10 nm thick) on the cathode electrode 12 as the electron injection layer (hole blocking layer) 14 and applying (6,6')-phenyl-C61-butyric acid methyl ester (PCBM), i.e., an n-type semiconductor on the electron injection layer 14 as the photoelectric conversion layer 11a. Poly-3-hexylthiophene (P3HT), i.e., a p-type polymer semiconductor is applied on the photoelectric conversion layer 11a as the photoelectric conversion layer 11b by spin coating. At this time, a 1,2-dichlorobenzene solvent which can dissolve both the p-type and n-type semiconductors, is used so that the interface area between the p-type and n-type semiconductors becomes large. Alternatively, the p-type semiconductor layer may be applied after the surface of the n-type semiconductor layer is formed to provide the surface with a physically finely irregular structure by nanoimprinting or the like. Alternatively, the photoelectric conversion layer 11 may be formed by directly applying a mixed solution of P3HT and PCBM by spin coating.

A poly(3,4-ethylenedioxythiophene)/poly(styrenesulfonic acid) complex (PEDOT:PSS) film (50 nm thick) is applied by spin coating and formed on the anode electrode 13 as the hole injection layer 15. Subsequently, lamination press is performed under reduced pressure at 80° C. so that the photoelectric conversion layer 11 and the hole injection layer 15 are in contact with each other to manufacture the photovoltaic cell 10.

Meanwhile, the edge surface of each layer is sealed with an epoxy resin.

Subsequently, antireflection films (not shown) are attached on the surfaces of the PET films having the cathode electrode 12 and the anode electrode 13 thereon.

The photovoltaic cell 10 of the present example has two transparent surfaces to utilize light on both the surfaces efficiently. The photovoltaic cell 10 has a high efficiency of energy conversion and retains the output thereof for a comparatively long term with easy sealing and even without a moisture-removing agent or an oxygen removing agent. Thus, the photovoltaic cell 10 is lightweight and flexible.

Comparative Example 1

For comparison, when unsubstituted graphene is used as the cathode electrode 12 in the example 1 instead of multi-layer graphene partially substituted with nitrogen atoms, the energy conversion efficiency is decreased by half or less.

Example 2

In the organic EL element 20 shown in FIG. 2, the cathode electrode 22 and the anode electrode 23 are formed as well as in the example 1.

LiF (1.5 nm) is deposited on the cathode electrode 22 as the electron injection layer 24. Tris(8-hydroxyquinoline) aluminum (Alq3) is deposited as a layer 21a on the layer 24. Alq3 serves as an n-type semiconductor to transport electrons. N,N'-di-1-naphthyl-N,N'-diphenyl-1,1'-biphenyl-4,4'-diamine (NPD) (30 nm) is deposited on the layer 21a as a layer 21b. The NPD layer 21b serves as a p-type semiconductor to transport holes and as a light-emitting layer. A poly(3,4-ethylenedioxythiophene)/poly(styrenesulfonic acid) complex (PEDOT/PSS) film (50 nm) is applied on the anode electrode 23 by spin coating as the hole injection layer 25. Lamination press is performed under reduced pressure at 80° C. so that the photoelectric conversion layer 21 and the hole injection layer 25 are in contact with each other to manufacture the organic EL element 20.

Meanwhile, the edge surface of each layer is sealed with an epoxy resin.

Also, films (not shown) are attached on the surfaces of the PET films having the cathode electrode 22 and the anode electrode 23 thereon. The films have rough surfaces to allow it to enhance the light-extraction efficiency of the organic EL element 20.

The organic EL element 20 of the present example is capable of double-sided light emission and has a high light-emitting efficiency. The organic EL element 20 retains the output thereof for a comparatively long term with easy sealing and even without a moisture-removing agent or an oxygen removing agent. Thus, organic EL element 20 is lightweight and flexible.

Comparative Example 2

For comparison, when unsubstituted graphene is used as the cathode electrode 22 in the example 2, the light-emitting efficiency is decreased by half or less.

Example 3

The photovoltaic cell 10 shown in FIG. 1 is manufactured as well as in the example 1 except for using monolayer graphene partially substituted with nitrogen atoms, a stainless steel foil (SUS304), and an $MoO_3$ vacuum-deposited film (10 nm) as the cathode electrode 12, the anode electrode 13, and the hole injection layer 15, respectively.

In the photovoltaic cell 10 of the present example, although light from the anode electrode 13 is not utilized, reflected light from the anode electrode can be utilized. Therefore, the photovoltaic cell 10 has a high efficiency of energy conversion. The photovoltaic cell 10 retains the output thereof for a comparatively long term with easy sealing and even without a moisture-removing agent or an oxygen-removing agent. Thus, the photovoltaic cell 10 is lightweight and flexible.

Comparative Example 3

For comparison, when unsubstituted graphene is used as the cathode electrode 12 in the example 3, the energy conversion efficiency is decreased by half or less.

Example 4

The organic EL element 20 shown in FIG. 2 is manufactured as well as in the example 2 except for using monolayer graphene partially substituted with nitrogen atoms, a stainless steel foil (SUS304), and an $MoO_3$ vacuum-deposited film (10 nm) for the cathode electrode 22, the anode electrode 23, and the hole injection layer 25, respectively.

In the organic EL element 20 of the present example, although light is not emitted from the anode electrode 23, light is reflected from the anode electrode-23, thereby increasing the light-emitting amount from the cathode electrode 22. Therefore, the organic EL element 20 has a high light-emitting efficiency. The organic EL element 20 retains the output thereof for a comparatively long term with easy sealing and even without a moisture-removing agent or an oxygen removing agent. Thus, the organic EL cell 20 is lightweight and flexible.

Comparative Example 4

For comparison, when unsubstituted graphene is used as the cathode electrode 22 in the example 4, the light emitting efficiency is decreased by half or less.

Example 5

In the photovoltaic cell 10 shown in FIG. 1, the cathode electrode 12 is a sheet in which planar monolayer graphene partially substituted with nitrogen atoms and boron atoms is transferred to a PET film. The planar monolayer graphene substituted with nitrogen atoms and boron atoms is produced by CVD at 1000° C. for 5 minutes using a Cu foil as a base catalyst layer and in a mixed reaction gas stream of ammonia, methane, diborane, hydrogen, and argon (15:60:15:65:200 ccm). Subsequently, after the graphene is processed at 1000° C. for 5 minutes in a mixed gas stream of ammonia and argon, the graphene is cooled in an argon gas stream. The surface of the Cu foil is annealed beforehand by laser irradiation heating to grow the crystal grains of the Cu foil. After the PET film (150 μm thick) and the monolayer graphene are pressure-bonded, the pressure-bonded is immersed in an ammonia alkaline copper chloride etchant to dissolve Cu, thereby transferring the monolayer graphene to the PET film. 4 monolayers of the graphene are laminated on the PET film through repeating the same steps. The doping amounts of nitrogen atoms and boron atoms are estimated by X-ray photoelectron spectroscopy (XPS) to be 2 to 5 atom % under these conditions. The work function is measured in a vacuum by UPS, thereby being equivalent to or slightly larger than that of Al. Subsequently, metal wiring for power collection is formed by pressure bonding using an Al ribbon.

The anode electrode 13 is produced as follows. Planar monolayer graphene substituted with boron atoms is produced by CVD at 1000° C. for 5 minutes using a Cu foil as a base catalyst layer and in a mixed reaction gas stream of methane, diborane, hydrogen, and argon (60:15:65:200 ccm). Subsequently, after the graphene is processed at 1000° C. for 5 minutes in a gas mixed stream of diborane and argon, the graphene is cooled in an argon gas stream. The surface of the Cu foil is annealed beforehand by laser irradiation heating to grow the crystal grains of the Cu foil. After the PET film (150 μm thick) and the monolayer graphene are pressure-bonded, the pressure-bonded is immersed in an ammonia alkaline copper chloride etchant to dissolve Cu, thereby transferring the monolayer graphene to the PET film. 4 monolayers of the graphene are laminated on the PET film through repeating the same steps. The doping amounts of nitrogen atoms and boron atoms (B/C atomic ratio) are estimated by X-ray photoelectron spectroscopy (XPS) to be 1 to 4 atom % under these conditions. Subsequently, metal wiring for power collection is formed by pressure bonding using an Al ribbon.

A cesium carbonate aqueous solution is applied on the cathode electrode 12 as the electron injection layer 14 by spin coating. Subsequently, a mixed solution of PCBM and P3HT is applied by spin coating as the first photoelectric conversion layer with a film thickness of 60 nm.

A PEDOT:PSS film (50 nm thick) is applied on the anode electrode 13 as the hole injection layer 15 by spin coating. A mixed solution of PCBM and P3HT is further applied thereon by spin coating to form the second photoelectric conversion layer with a film thickness of 60 nm.

The two photoelectric conversion layers are laminated so as to be in contact with each other. Subsequently, lamination press is performed under reduced pressure at 80° C. to produce the photoelectric conversion layer 11. Thus, the photovoltaic cell 10 is manufactured.

Meanwhile, the edge surface of each layer is sealed with an epoxy resin.

The photovoltaic cell 10 of the present example has two transparent surfaces to utilize light on both the transparent surfaces efficiently. The photovoltaic cell 10 has a high efficiency of energy conversion and retains the output thereof for a comparatively long term with easy sealing and even without a moisture-removing agent or an oxygen removing agent. Thus, the photovoltaic cell 10 is lightweight and flexible.

Comparative Example 5

For comparison, when unsubstituted graphene is used as the cathode electrode 12 in the example 5, the energy conversion efficiency is decreased by half or less.

Example 6

The organic EL element 20 shown in FIG. 2 is manufactured as well as in the example 2 except for using 4 layers of the graphene partially substituted with nitrogen and boron atoms and 4 layers of graphene partially substituted with boron atoms as the cathode electrode 22 and the anode electrode 23 in the example 2, respectively. The cathode electrode 22 and the anode electrode 23 are produced as well as in the example 5.

The organic EL element 20 of the present example has a high light-emitting efficiency. The organic EL element 20 also retains the output thereof for a comparatively long term with easy sealing and even without a moisture-removing agent or an oxygen removing agent. Thus, the organic EL element 20 is lightweight and flexible.

Comparative Example 6

For comparison, when unsubstituted graphene is used as the cathode electrode 22 in the example 6, the light-emitting efficiency is decreased by half or less.

Example 7

The photovoltaic cell 10 shown in FIG. 1 is manufactured as well as in the example 3 except for using mixtures of 2 to 6 layers of graphene partially substituted with nitrogen atoms and oxygen atoms as the cathode electrode 12.

A producing method of the cathode electrode 12 will be specifically described below.

The cathode electrode 12 is produced as follows. Graphene oxide to be obtained by oxidizing graphite is dispersed in water. The graphene oxide dispersed in water is applied on a Cu foil by spin coating. After the graphene on the Cu foil is processed at 800° C. for 10 minutes in a mixed reaction gas stream of ammonia, hydrogen, and argon (30:60:200 ccm), the processed graphene is cooled in argon. After the PET film (150 μm thick) and the Cu foil are pressure-bonded, the pressure-bonded is immersed in an ammonia alkaline copper chloride etchant to dissolve Cu, thereby transferring the monolayer graphene to the PET film. A cross-section TEM observation revealed that the graphene layers were mixtures of 2 to 6 layers. The doping amounts of nitrogen atoms and oxygen atoms (N/C atom ratio and O/C atom ratio) are estimated by X-ray photoelectron spectroscopy (XPS) to be 2 to 5 atom % and 0.5 to 2 atom %, respectively. The work function is measured in a vacuum by UPS, thereby being equivalent to or slightly larger than that of Al. Subsequently, metal wiring for power collection is formed by pressure bonding using an Al ribbon.

The photovoltaic cell 10 of the present example can be manufactured easily and has a high efficiency of energy conversion. The photovoltaic cell 10 has a high efficiency of energy conversion and retains the output thereof for a comparatively long term with easy sealing and even without a moisture-removing agent or an oxygen removing agent. Thus, the photovoltaic cell 10 is lightweight and flexible.

Comparative Example 7

For comparison, when nitrogen-unsubstituted graphene made of graphene oxide is used as the cathode electrode 12 in the example 7, the energy conversion efficiency is decreased by half or less.

Example 8

The organic EL element 20 shown in FIG. 2 is manufactured as well as in the example 4 except for using mixtures of 2 to 6 layers of graphene partially substituted with nitrogen atoms and oxygen atoms as the cathode electrode 22. The cathode electrode 22 is formed as well as in the example 7.

The organic EL element 20 of the present example has a high light-emitting efficiency and retains the output thereof for a comparatively long term with easy sealing and even without a moisture-removing agent or an oxygen removing agent. Thus, the organic EL element 20 is lightweight and flexible.

Comparative Example 8

For comparison, when nitrogen-unsubstituted graphene made of graphene oxide is used as the cathode electrode 22 in the example 8, the energy conversion efficiency is decreased by half or less.

Example 9

The photovoltaic cell 10 shown in FIG. 1 is manufactured as well as in the example 3 except for using mixtures of 2 to 6 layers of graphene partially substituted with nitrogen atoms, oxygen atoms, and phosphorus atoms as the cathode electrode 12.

A producing method of the cathode electrode 12 will be specifically described below.

The cathode electrode 12 is produced as follows. Graphene oxide to be obtained by oxidizing graphite is dispersed in water. The graphene oxide dispersed in water is applied on a Cu foil by spin coating. After the applied graphene oxide on the Cu foil is processed at 800° C. for 10 minutes in a mixed reaction gas of ammonia, phosphine, hydrogen, and argon (30:10:60:200 ccm), the processed is cooled in an argon gas stream. After the PET film (150 μm thick) and the Cu foil are pressure-bonded, the pressure-bonded is immersed in an ammonia alkaline copper chloride etchant to dissolve Cu, thereby transferring the monolayer graphene to the PET film. A cross-section TEM observation revealed that the graphene layers were mixtures of 2 to 6 layers. The doping amounts of nitrogen atoms, oxygen atoms, and phosphorus atoms (N/C atomic ratio, 0/C atomic ratio, and P/C atomic ratio) are estimated by X-ray photoelectron spectroscopy (XPS) to be 1 to 4 atom %, 0.5 to 2 atom %, and 0.3 to 0.9 atom %, respectively. The work function is measured in a vacuum by UPS, thereby being equivalent to or slightly larger than that of Al. Subsequently, metal wiring for power collection is formed by pressure bonding using an Al ribbon.

The photovoltaic cell 10 of the present example can be manufactured easily. The photovoltaic cell 10 has a high efficiency of energy conversion and retains the output thereof for a comparatively long term with easy sealing and even without a moisture-removing agent or an oxygen removing agent. Thus, the photovoltaic cell 10 is lightweight and flexible.

Comparative Example 9

For comparison, when nitrogen-unsubstituted graphene made of graphene oxide is used as the cathode electrode 12 in the example 9, the energy conversion efficiency is decreased by half or less.

Example 10

The organic EL element 20 shown in FIG. 2 is manufactured as well as in the example 4 except for using mixtures of 2 to 6 graphene layers partially substituted with nitrogen atoms, oxygen atoms, and phosphorus atoms as the cathode electrode 22. The cathode electrode 22 is produced as well as in the example 9.

The organic EL element 20 of the present example has a high light-emitting efficiency. The organic EL element 20 retains the output thereof for a comparatively long term with easy sealing and even without a moisture-removing agent or an oxygen removing agent. Thus, organic EL element 20 is lightweight and flexible.

Comparative Example 10

For comparison, when nitrogen-unsubstituted graphene made of graphene oxide is used as the cathode electrode 22 in the example 10, the light-emitting efficiency is decreased by half or less.

Example 11

The photovoltaic cell 10 shown in FIG. 1 is manufactured as well as in the example 3 except for using mixtures of 2 to 6 layers of graphene partially substituted with nitrogen atoms, oxygen atoms, and phosphorus atoms as the cathode electrode 12.

A producing method of the cathode electrode 12 will be specifically described below.

The cathode electrode 12 is produced as follows. Graphene oxide to be obtained by oxidizing graphite is dispersed in water. The graphene oxide dispersed in water is applied on a Cu foil by spin coating. After the graphene oxide on the Cu foil is processed at 800° C. for 10 minutes in a mixed reaction gas stream containing ammonia, arsine, hydrogen, and argon (30:10:60:200 ccm), the processed is cooled in an argon gas stream. After the PET film (150 μm thick) and the Cu foil are pressure-bonded, the pressure-bonded is immersed in an ammonia alkaline copper chloride etchant to dissolve Cu, thereby transferring the monolayer graphene to the PET film. A cross-section TEM observation revealed that the graphene layers were mixtures of 2 to 6 layers. The doping amounts of nitrogen atoms, oxygen atoms, and arsenic atoms (N/C atomic ratio, 0/C atomic ratio, and AS/C atomic ratio) are estimated by X-ray photoelectron spectroscopy (XPS) to be 1 to 4 atom %, 0.5 to 2 atom %, and 0.2 to 0.7 atom %, respectively. The work function is measured in a vacuum by UPS, thereby being equivalent to or slightly larger than that of Al. Subsequently, metal wiring for power collection is formed by pressure bonding using an Al ribbon.

The photovoltaic cell 10 of the present example can be manufactured easily and has a high efficiency of energy conversion. The photovoltaic cell 10 retains the output thereof for a comparatively long term with easy sealing and even without a moisture-removing agent or an oxygen removing agent. Thus, the photovoltaic cell 10 is lightweight and flexible.

Comparative Example 11

For comparison, when nitrogen-unsubstituted graphene made of graphene oxide is used as the cathode electrode 12 in the example 11, the energy conversion efficiency is decreased by half or less.

Example 12

The organic EL element 20 shown in FIG. 2 is manufactured as well as in the example 4 except for using mixtures of 2 to 6 layers of graphene partially substituted with nitrogen atoms, oxygen atoms, and arsenic atoms as the cathode electrode 22. The cathode electrode 22 is produced as well as in the example 11.

The organic EL element 20 of the present example has a high light-emitting efficiency and retains the output thereof for a comparatively long term with easy sealing and even without a moisture-removing agent or an oxygen removing agent. Thus, the organic EL element 20 is lightweight and flexible.

Comparative Example 12

For comparison, when nitrogen-unsubstituted graphene made of graphene oxide is used as the cathode electrode 22 in the example 12, the energy conversion efficiency is decreased by half or less.

Example 13

The photovoltaic cell element 10 shown in FIG. 1 is manufactured as well as in the example 1 except for using 4-layer laminated graphene partially substituted with nitrogen atoms and doped with magnesium, 4-layer laminated unsubstituted graphene doped with nitric acid, and $MoO_3$ as the cathode electrode 12, the anode electrode 13, and the hole injection layer 15, respectively.

The magnesium doping into the cathode electrode 12 is conducted by vacuum-depositing a magnesium metal on the 4-layer laminated graphene partially substituted with nitrogen. When the cathode electrode 12 is observed by TEM, nanosized metal particles are seen therein. Also, the 4-layer laminated unsubstituted-graphene is immersed in a dilute nitric acid aqueous solution for the nitric-acid doping into the anode electrode 13.

The photovoltaic cell 10 of the present example has a high efficiency of energy conversion. The photovoltaic cell 10 retains the output thereof for a comparatively long term with easy sealing and even without a moisture-removing agent or an oxygen-removing agent. Thus, the photovoltaic cell 10 is lightweight and flexible.

Comparative Example 13

For comparison, when unsubstituted graphene is used as the cathode electrode 12 in the example 13, the energy conversion efficiency is decreased by half or less.

Example 14

The organic EL element 20 shown in FIG. 2 is manufactured as well as in the example 2 except for using 4-layer laminated graphene partially substituted with nitrogen atoms and doped with magnesium, 4-layer laminated unsubstituted-graphene doped with nitric acid, and $MoO_3$ as the cathode electrode 22, the anode electrode 23, and the hole injection layer 25, respectively.

The magnesium doping into the cathode electrode 12 is conducted by vacuum-depositing a magnesium metal on the 4-layer-laminated graphene partially substituted with nitrogen. When the cathode electrode 12 is observed by TEM, nanosized metal particles are seen therein. For the nitric-acid doping into the anode electrode 23, the 4-layer-laminated unsubstituted-graphene is immersed in a dilute nitric acid aqueous solution.

The organic EL element 20 of the present example is capable of double-sided light emission with a high light-emitting efficiency. The organic EL element 20 retains the output thereof for a comparatively long term with easy sealing and even without a moisture-removing agent or an oxygen removing agent. Thus, the organic EL element 20 is lightweight and flexible.

Comparative Example 14

For comparison, when unsubstituted graphene is used as the cathode electrode 22 in the example 14, the light-emitting efficiency is decreased by half or less.

Example 15

The photovoltaic cell 10 shown in FIG. 1 is manufactured as well as in the example 1 except for using an electrode containing a monolayer carbon nanotube as the anode electrode 13. The anode electrode 13 is produced by applying a water dispersion of a mixture of a monolayer carbon nanotube and PEDOT:PSS onto a PET film by spin coating. The mixture has a ratio of 3:1 by weight.

The photovoltaic cell 10 of the present example has a high efficiency of energy conversion and retains the output thereof for a comparatively long term with easy sealing and even without a moisture-removing agent or an oxygen removing agent. Thus, the photovoltaic cell 10 is lightweight and flexible.

Comparative Example 15

For comparison, when unsubstituted graphene is used as the cathode electrode 12 in the example 15, the energy conversion efficiency is decreased by half or less.

Example 16

The organic EL element 20 shown in FIG. 2 is manufactured as well as in the example 2 except for using an electrode containing a monolayer carbon nanotube for the anode electrode 23. The anode electrode 23 is produced by applying a water dispersion of a mixture of a monolayer carbon nanotube and PEDOT:PSS onto a PET film by spin coating. The mixture has a ratio of 3:1 by weight.

The organic EL element 20 of the present example is capable of double-sided light emission and has a high light-emitting efficiency. The organic EL element 20 retains the output thereof for a comparatively long term with easy sealing and even without a moisture-removing agent or an oxygen removing agent. Thus, organic EL element 20 is lightweight and flexible.

Comparative Example 16

For comparison, when unsubstituted graphene is used as the cathode electrode 22 in the example 16, the light-emitting efficiency is decreased by half or less.

Example 17

The photovoltaic cell element 10 shown in FIG. 1 is manufactured as well as in the example 1 except for using a molybdenum/stainless thin film and a CIGS film as the anode electrode 13 and the photoelectric conversion layer 11, respectively.

A manufacturing method of the photovoltaic cell 10 will be specifically described below.

Molybdenum is deposited on a stainless steel (SUS304) foil to form the anode electrode 13. A Cu—Ga film and an In film are formed on the anode electrode 13. Selene is introduced to the Cu—Ga and In films to form a CIGS film as a photoelectric conversion layer 11. A CdS film is formed as the electron injection layer 14. The graphene layers partially substituted with nitrogen atoms are formed on the PET film as well as in the example 1. The graphene layers formed undergo vacuum lamination press under reduced pressure at 80° C. to manufacture the photovoltaic cell 10.

The photovoltaic cell 10 of the present example has a high efficiency of energy conversion. The photovoltaic cell 10 retains the output thereof for a comparatively long term with easy sealing and even without a moisture-removing agent or an oxygen-removing agent. Thus, the photovoltaic cell 10 is lightweight and flexible.

Comparative Example 17

For comparison, when unsubstituted graphene is used as the cathode electrode 12 in the example 17, the energy-conversion efficiency is decreased by half or less.

Example 18

The photovoltaic cell element 10 shown in FIG. 1 is manufactured as well as in the example 1 except for using a thin silicon film as the photoelectric conversion layer 11.

A manufacturing method of the photovoltaic cell 10 will be specifically described below.

A microcrystalline (n-i-p) Si layer and a buffer (oxide film) layer are formed on the cathode electrode 12. An amorphous (p-i-n) Si layer is formed on the anode electrode 13. Vacuum lamination press is performed under reduced pressure at 100° C. so that the buffer (oxide film) layer and the microcrystalline (n-i-p) Si layer are in contact with each other to manufacture the photovoltaic cell 10.

The photovoltaic cell 10 of the present example has a high efficiency of energy conversion. The photovoltaic cell 10 retains the output thereof for a comparatively long term with easy sealing and even without a moisture-removing agent or an oxygen-removing agent. Thus, the photovoltaic cell 10 is lightweight and flexible.

Comparative Example 18

For comparison, when unsubstituted graphene is used as the cathode electrode 12 in the example 18, the energy-conversion efficiency is decreased by half or less.

Example 19

The photovoltaic cell element 10 shown in FIG. 1 is manufactured as well as in the example 1 except for using a graphene monolayer partially substituted with nitrogen atoms produced by a different method and a corrosion-resistant stainless-steel foil as the cathode electrode 12 and the anode electrode 13, respectively.

A producing method of the cathode electrode 12 will be specifically described below.

The cathode electrode 12 is produced by CVD at 1000° C. for 5 minutes with a Cu foil as a base catalyst layer and with a mixed reaction gas stream of methane, hydrogen, and argon (60:65:200 ccm). Thereafter, the cathode electrode 12 produced is cooled in an argon gas stream. The surface of the Cu foil is beforehand annealed by laser irradiation heating to grow the crystal grains of the Cu foil. Subsequently, the cooled cathode electrode 12 is processed for 30 minutes in nitrogen plasma (0.1 millibar) using a magnetron sputtering system (13.56 MHz, 150 W). After the PET film (150 μm thick) and the Cu foil are pressure-bonded, the press-bonded is immersed in an ammonia alkaline copper chloride etchant to dissolve Cu, thereby transferring graphene layer to the PET film. The doping amount of nitrogen atoms (N/C atom ratio) is estimated by X-ray photoelectron spectroscopy (XPS) to be 0.5 to 3 atom %. The work function is measured in a vacuum by UPS, thereby being equivalent to or slightly smaller than that of Al. Subsequently, metal wiring for power collection is formed by pressure bonding using an Al ribbon.

The photovoltaic cell 10 of the present example can be manufactured easily. The photovoltaic cell 10 has a high efficiency of energy conversion. The photovoltaic cell 10 also retains the output thereof for a comparatively long term with easy sealing and even without a moisture-removing agent or an oxygen-removing agent. Thus, the photovoltaic cell 10 is lightweight and flexible.

Comparative Example 19

For comparison, when unsubstituted graphene is used as the cathode electrode 12 in the example 19, the energy conversion efficiency is decreased by half or less.

Example 20

The organic EL element 20 shown in FIG. 2 is manufactured as well as in the example 2 except for using a graphene monolayer partially substituted with nitrogen atoms produced by a different method and a corrosion-resistant stainless steel foil as the cathode electrode 22 and the anode electrode 23, respectively. The photoelectric conversion layer 21 is the same as that in the example 4. The cathode electrode 22 is produced as well as in the example 19.

The organic EL element 20 of the present example has a high light-emitting efficiency and retains the output thereof for a comparatively long term with easy sealing and even without a moisture-removing agent or an oxygen removing agent. Thus, organic EL element 20 is lightweight and flexible.

Comparative Example 20

For comparison, when unsubstituted graphene is used as the cathode electrode 22 in the example 20, the light-emitting efficiency is decreased by half or less.

Example 21

The photovoltaic cell 10 shown in FIG. 1 is manufactured as well as in the example 3 except for using a graphene monolayer partially substituted with nitrogen atoms produced by a different method as the cathode electrode 12.

A producing method of the cathode electrode 12 will be specifically described below.

The cathode electrode 12 is produced by CVD at 1000° C. for 5 minutes using a Cu foil as a base catalyst layer and in a mixed reaction gas stream of pyridine, ethylene, hydrogen, and argon (15:60:65:200 ccm). Thereafter, the cathode electrode 12 produced is cooled in an argon gas stream. The surface of the Cu foil is beforehand annealed by laser irradiation heating to grow the crystal grains of the Cu foil. After the PET film (150 μm thick) and the Cu foil are pressure-bonded, the pressure-bonded is immersed in an ammonia alkaline copper chloride etchant to dissolve Cu, thereby transferring graphene layer to the PET film. The doping amount of nitrogen atoms (N/C atom ratio) is estimated by X-ray photoelectron spectroscopy (XPS) to be 1 to 3 atom %. The work function is measured in a vacuum by UPS, thereby being equivalent to or slightly smaller than that of Al. Subsequently, metal wiring for power collection is formed by pressure bonding using an Al ribbon.

The photovoltaic cell 10 of the present example can be manufactured easily and has a high efficiency of energy conversion. The photovoltaic cell 10 retains the output thereof for a comparatively long term with easy sealing and even without a moisture-removing agent or an oxygen-removing agent. Thus, the photovoltaic cell 10 is lightweight and flexible.

Comparative Example 21

For comparison, when unsubstituted graphene is used as the cathode electrode 12 in the example 21, the energy conversion efficiency is decreased by half or less.

Example 22

The organic EL element 20 shown in FIG. 2 is manufactured as well as in the example 4 except for using a graphene monolayer partially substituted with nitrogen atoms produced by a different method for the cathode electrode 22. The cathode electrode 22 is manufactured as well as in the example 21.

The organic EL element 20 of the present example has a high light-emitting efficiency and retains the output thereof for a comparatively long term with easy sealing and even without a moisture-removing agent or an oxygen removing agent. Thus, organic EL element 20 is lightweight and flexible.

Comparative Example 22

For comparison, when unsubstituted graphene is used as the cathode electrode 22 in the example 22, the light-emitting efficiency is decreased by half or less.

Example 23

The organic EL element 20 shown in FIG. 2 is manufactured as well as in the example 6 except for using a polymer light-emitting layer and cesium carbonate as the photoelectric conversion layer 21 and the electron injection layer 24, respectively.

Producing methods of the photoelectric conversion layer 21 and the electron injection layer 24 will be specifically described below.

4-layer graphene partially substituted with nitrogen atoms and boron atoms are used as the cathode electrode 22 as well as in the example 6. A cesium carbonate aqueous solution is applied on the 4-layer graphene by spin coating to form the electron injection layer 24. On the electron injection layer 24, a mixed solution of poly(9-vinylcarbazole) as a p-type polymer, an oxadiazole derivative as an n-type low-molecular compound expressed by Chemical Formula 1, and a phosphorescent luminous agent expressed by Chemical Formula 2 (at a ratio of 10:5:1 by weight) is applied by spin coating to form the photoelectric conversion layer 21.

The organic EL element 20 of the present example has a high light-emitting efficiency. The organic EL element 20 also retains the output thereof for a comparatively long term with easy sealing and even without a moisture-removing agent or an oxygen removing agent. Thus, organic EL element 20 is lightweight and flexible.

[Chemical Formula 1]

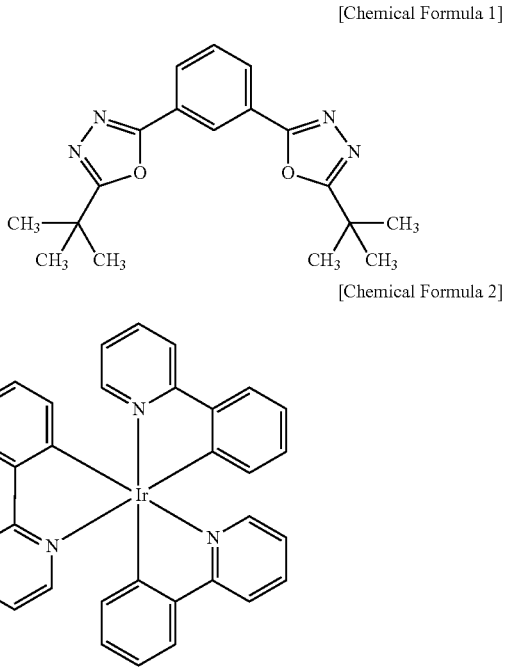

[Chemical Formula 2]

Comparative Example 23

For comparison, when unsubstituted graphene is used as the cathode electrode 22 in the example 23, the light-emitting efficiency is decreased by half or less.

Example 24

The photovoltaic cell element 10 shown in FIG. 1 is manufactured as well as in the example 1 except for using a carbon nanotube partially substituted with nitrogen atoms as the cathode electrode 12.

A producing method of the cathode electrode 12 will be specifically described below.

An unsubstituted monolayer carbon nanotube is processed for 30 minutes in nitrogen plasma (0.1 millibar) using a magnetron sputtering system (13.56 MHz, 150 W) to obtain a monolayer carbon nanotube partially substituted with nitrogen atoms. Subsequently, a water dispersion of the monolayer carbon nanotubes partially substituted with nitrogen atoms is applied on a PET film (150 μm thick) by spin coating. The doping amount of nitrogen atoms (N/C atom ratio) is estimated by X-ray photoelectron spectroscopy (XPS) to be 0.5 to 2 atom %. The work function is measured in a vacuum by UPS, thereby being equivalent to that of Al. Subsequently, metal wiring for power collection is formed by pressure bonding using an Al ribbon.

The photovoltaic cell 10 of the present example can be manufactured easily and has a high efficiency of energy conversion. The photovoltaic cell 10 has a high efficiency of energy conversion and retains the output thereof for a comparatively long term with easy sealing and even without a moisture-removing agent or an oxygen removing agent. Thus, the photovoltaic cell 10 is lightweight and flexible.

Comparative Example 24

For comparison, when unsubstituted graphene is used as the cathode electrode 12 in the example 24, the energy conversion efficiency is decreased by half or less.

Example 25

The organic EL element 20 shown in FIG. 2 is manufactured as well as in the example 2 except for using carbon nanotubes partially substituted with nitrogen atoms as the cathode electrode 22. The carbon nanotubes partially substituted with nitrogen atoms are formed as well as in the example 24.

The organic EL element 20 of the present example has a high light-emitting efficiency and retains the output thereof for a comparatively long term with easy sealing and even without a moisture-removing agent or an oxygen removing agent. Thus, the organic EL element 20 is lightweight and flexible.

Comparative Example 25

For comparison, when unsubstituted graphene is used as the cathode electrode 22 in the example 25, the light-emitting efficiency is decreased by half or less.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A photoelectric conversion element comprising:
a photoelectric conversion layer;
a cathode electrode which is arranged on one surface of the photoelectric conversion layer and comprises monolayer graphene, multilayer graphene, or both, in which a portion of carbon atoms is substituted with at least nitrogen atoms; and
an anode electrode which is arranged on the other surface of the photoelectric conversion layer,
wherein a substitution amount of nitrogen atoms is from 0.1 to 30 atom %.

2. The element according to claim 1, wherein
the monolayer graphene, the multilayer graphene, or both, are planar.

3. The element according to claim 1, wherein
a work function of the cathode electrode is equivalent to or smaller than the work function of aluminum.

4. The element according to claim 1, wherein
a portion of carbon atoms is further substituted with at least one atom selected from the group consisting of oxygen atom, boron atom, phosphorus atom, and arsenic atom.

5. The element according to claim 1, further comprising an electron injection layer between the cathode electrode and the photoelectric conversion layer.

6. The element according to claim 5, wherein the electron injection layer is at least one material selected from the group consisting of LiF, $Cs_2CO_3$, and ZnO.

7. The element according to claim 1, wherein
the anode electrode comprises at least one material selected from the group consisting of unsubstituted monolayer graphene, unsubstituted multilayer graphene, monolayer graphene substituted with boron atoms, and multilayer graphene substituted with boron atoms.

8. The element according to claim 1, wherein
the graphene of the cathode electrode is doped with electron donating molecules or atoms, or the graphene of the anode electrode is doped with electron accepting molecules or atoms.

9. The element according to claim 1, wherein the anode electrode comprises at least one metal electrode selected from the group consisting of stainless steel, copper, molybdenum, chromium, and nickel.

10. The element according to claim 1, wherein a substitution amount of nitrogen atoms is from 1 to 10 atom %.

11. A photoelectric conversion element comprising:
a photoelectric conversion layer;
a cathode electrode which is arranged on one surface of the photoelectric conversion layer and comprises monolayer graphene, multilayer graphene, or both, in which a portion of carbon atoms is substituted with at least nitrogen atoms; and
an anode electrode which is arranged on the other surface of the photoelectric conversion layer,
wherein a substitution amount of nitrogen atoms is from 1 to 30 atom %.

* * * * *